(12) United States Patent
Kinoshita et al.

(10) Patent No.: US 10,410,995 B2
(45) Date of Patent: Sep. 10, 2019

(54) IMAGE PROCESSING DEVICE HAVING AN INTEGRATED CIRCUIT CHIP, A FIRST MEMORY CHIP AND A SECOND MEMORY CHIP, AND CONTROL METHOD THEREFOR

(71) Applicant: CANON KABUSHIKI KAISHA, Tokyo (JP)

(72) Inventors: Ayaka Kinoshita, Kawasaki (JP); Takayuki Kamiya, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/801,527

(22) Filed: Nov. 2, 2017

(65) Prior Publication Data

US 2018/0138153 A1    May 17, 2018

(30) Foreign Application Priority Data

Nov. 16, 2016    (JP) .................. 2016-223292

(51) Int. Cl.
| | |
|---|---|
| *H04N 5/225* | (2006.01) |
| *H01L 25/065* | (2006.01) |
| *G06T 1/20* | (2006.01) |
| *G11C 5/04* | (2006.01) |
| *G11C 5/14* | (2006.01) |
| *H01L 25/10* | (2006.01) |
| *G11C 7/04* | (2006.01) |

(52) U.S. Cl.
CPC ............ *H01L 25/0657* (2013.01); *G06T 1/20* (2013.01); *G11C 5/04* (2013.01); *G11C 5/14* (2013.01); *H01L 25/105* (2013.01); *G11C 7/04* (2013.01); *H01L 2224/16227* (2013.01); *H01L 2225/1023* (2013.01); *H01L 2225/1058* (2013.01); *H01L 2924/1434* (2013.01); *H01L 2924/15311* (2013.01); *H01L 2924/15331* (2013.01)

(58) Field of Classification Search
CPC .................................................... H01L 25/0657
USPC ....................................................... 348/220.1
See application file for complete search history.

(56) References Cited

U.S. PATENT DOCUMENTS

| | | | | |
|---|---|---|---|---|
| 2011/0025699 A1* | 2/2011 | Ogawa | ..................... | H01L 25/18 345/531 |
| 2015/0286875 A1* | 10/2015 | Land | ...................... | H04N 19/46 382/103 |
| 2016/0227083 A1* | 8/2016 | Imamura | ................ | G03B 17/14 |

FOREIGN PATENT DOCUMENTS

JP    2005-217205 A    8/2005

* cited by examiner

*Primary Examiner* — Usman A Khan
(74) *Attorney, Agent, or Firm* — Cowan, Liebowitz & Latman, P.C.

(57) ABSTRACT

An image processing device includes: an integrated circuit chip arranged on a substrate to perform processing on image data; a first memory chip arranged adjacent to the integrated circuit chip on the substrate and connected to the integrated circuit chip; and a second memory chip stacked on the integrated circuit chip and connected to the integrated circuit chip, wherein the integrated circuit chip sets, according to the processing content, any one of a plurality of operation modes including a first operation mode to operate the first memory chip and limit operation of the second memory chip, and a second operation mode to operate the first memory chip and the second memory chip.

16 Claims, 6 Drawing Sheets

IMAGE PROCESSING DEVICE HAVING AN INTEGRATED CIRCUIT CHIP, A FIRST MEMORY CHIP AND A SECOND MEMORY CHIP, AND CONTROL METHOD THEREFOR

BACKGROUND OF THE INVENTION

Field of the Invention

The present invention relates to an image processing device and a control method therefor.

Description of the Related Art

An image processing device such as a digital camera has an integrated circuit chap (LSI chip) for image processing, and a memory chip such as a DRAM. The LSI chip for image processing and the memory chip are formed as separate semiconductor chips. In general, the LSI chip for image processing and the memory chip are mounted adjacent to each other on the same substrate to perform data transfer via wiring on the substrate.

In Japanese Patent Application Laid-Open No. 2005-217205, Proposed is a semiconductor device in which a memory chip is stacked on top of an LSI chip. By stacking the LSI chip and the memory chip, it is possible to secure wiring resources on the substrate and improve the package density. Further, it is possible to increase the data transfer rate between the chips.

However, when the memory chip is stacked on the LSI chip as in the semiconductor device described in Japanese Patent Application Laid-Open No. 2005-217205, heat is likely to be accumulated in the device. A temperature rise increases leakage flow power of transistors, which leads to an increase in power consumption. Further, the high temperature may cause a malfunction of circuits. Recently, in the image processing device, the amount of image data to be processed has increased, and a plurality of memory chips have often been used. When a plurality of memory chips are stacked on the LSI chip, heat dissipation becomes worse and the temperature rise is promoted.

SUMMARY OF THE INVENTION

According to one aspect of the present invention, there is provided an image processing device including: an integrated circuit chip arranged on a substrate to perform processing on image data; a first memory chip arranged adjacent to the integrated circuit chip on the substrate and connected to the integrated circuit chip; and a second memory chip stacked on the integrated circuit chip and connected to the integrated circuit chip, wherein the integrated circuit chip sets, according to the processing content, any one of a plurality of operation modes including a first operation mode to operate the first memory chip and limit operation of the second memory chip, and a second operation mode to operate the first memory chip and the second memory chip.

According to another aspect of the present invention, there is provided a control method for an image processing device including: an integrated circuit chip arranged on a substrate to perform processing on image data; a first memory chip arranged adjacent to the integrated circuit chip on the substrate and connected to the integrated circuit chip; and a second memory chip stacked on the integrated circuit chip and connected to the integrated circuit chip, the control method including: determining the processing content; and setting any one of a plurality of operation modes including a first operation mode to operate the first memory chip and limit operation of the second memory chip, and a second operation mode to operate the first memory chip and the second memory chip.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
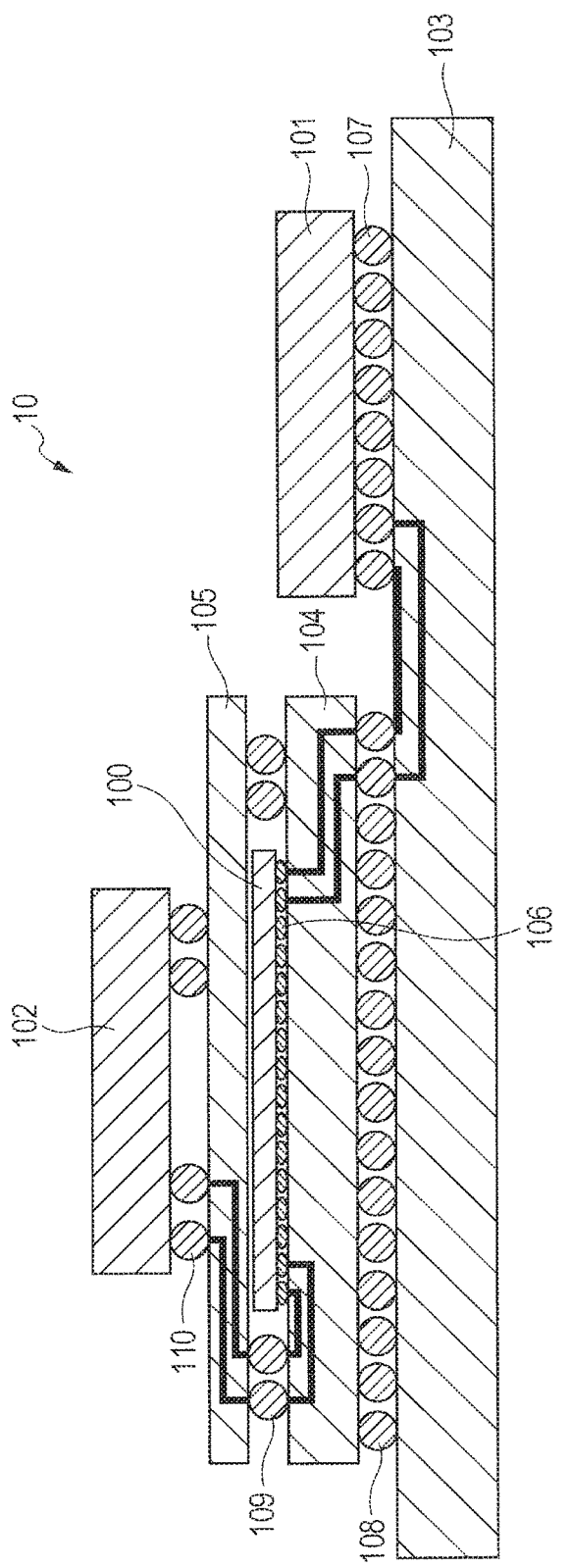
FIG. 1 is a sectional view of an image processing device in a first embodiment.

FIG. 1 is a sectional view of an image processing device 10 in the embodiment. The image processing device 10 is a device configured to process image data, such as a digital camera, a camcorder, a camera head, a mobile terminal, a surveillance camera, or a vehicle-mounted camera. The image processing device 10 includes an LSI (Large Scale Integration) chip 100, a first memory chip 101, a second memory chip 102, and a main substrate 103. The LSI chip 100 further includes an interposer 104, a relay substrate 105, microbumps 106, and solder balls 107 to 110.

The main substrate 103 is a printed wiring substrate including an insulator substrate and through holes that connect metal wirings and multi-layer metal wirings formed on the surface or an inner layer of the substrate. The main substrate 103 is of any type, such as a multi-layer substrate or a flexible substrate. The main substrate 103 is stored in a housing of the image processing device 10.

On the main substrate 103, the LSI chip 100, the first memory chip 101, and the second memory chip 102 are mounted. The LSI chip 100, the first memory chip 101, and the second memory chip 102 are separate semiconductor integrated circuit chips, respectively. The LSI chip 100 has a plurality of logic circuits (functional blocks) capable of performing processing such as image processing for input data, control of an optical system, control of an imaging unit, and generation of display data. Each of the first memory chip 101 and the second memory chip 102 is configured to include, for example, a two-channel DRAM (Dynamic Random Access Memory), and used as a storage area for processing performed by the LSI chip 100. However, each of the first memory chip 101 and the second memory chip 102 is not limited to the two-channel configuration, and may be configured to include a large-capacity memory such as any other type of RAM.

The LSI chip 100 and the first memory chip 101 are arranged adjacent to each other on the main substrate 103, and the second memory chip 102 is stacked on the LSI chip 100. The LSI chip 100 is mounted on the main substrate 103 through the interposer 104. The interposer 104 and the LSI chip 100 are electrically connected by flip-chip mounting through the microbumps 106. The main substrate 103 and the interposer 104 are electrically connected through the solder balls 108, and the main substrate 103 and the first memory chip 101 are electrically connected through the solder balls 107. The LSI chip 100 is electrically connected to the first memory chip 101 through the microbumps 106, the wiring of the interposer 104, the solder balls 108, the wiring on the main substrate 103, and the solder balls 107.

The second memory chip 102 is stacked and mounted on the LSI chip 100 through the relay substrate 105. The interposer 104 and the relay substrate 105 are electrically connected through the solder balls 109. The relay substrate 105 and the second memory chip 102 are electrically connected through the solder balls 110. The LSI chip 100 is electrically connected to the second memory chip 102 through the microbumps 106, the wiring of the interposer 104, the solder balls 109, the wiring of the relay substrate 105, and the solder balls 110. The image processing device 10 may also have a POP (Package On Package) structure in which the second memory chip 102 is directly mounted on the interposer 104 without using the relay substrate Unillustrated units, such as an imaging unit, an operating unit, a display unit, and a recording medium, are mounted on or connected through wiring to the main substrate 103.

Figure 2:
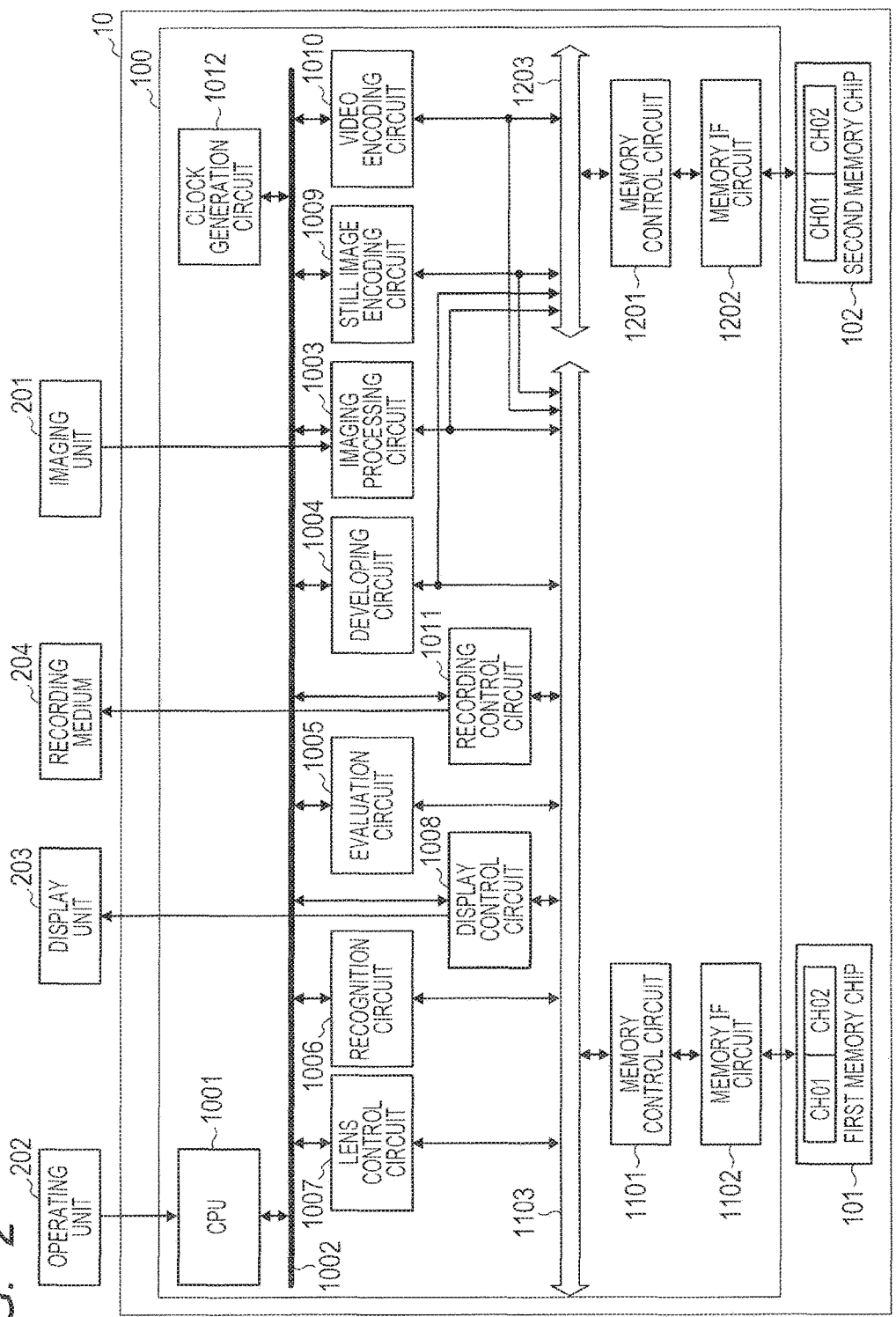
FIG. 2 is a block diagram of the image processing device in the first embodiment.

FIG. 2 is a block diagram of the image processing device 10 in the embodiment. Hereinafter, a digital camera using the image processing device 10 will be described as an example. The digital camera includes an imaging unit 201, an operating unit 202, a display unit 203, a recording medium 204, and the image processing device 10.

The imaging unit 201 includes an optical system, an image sensor, an AD (Analog Digital) converter, and the like. The optical system includes an optical filter, lens group, and an aperture to focus light from a subject on an imaging surface of the image sensor. The image sensor is, for example, a CMOS (Complementary Metal Oxide Semiconductor) image sensor to output a pixel signal based on incident light from the optical system. The AD converter converts an analog pixel signal to digital RAW data.

The operating unit 202 includes switches such as a power switch, a shutter button, a button to instruct the start/stop of video recording, and a menu switch to change the digital camera operation mode. The operating unit 202 may also include a SET button, cursor keys, a pointing device, a touch panel, and the like. For example, a user can operate the menu switch to select, as the mode of the digital camera, any one of a live view mode, a single still image shooting mode, a continuous still image shooting mode, a video recording mode, a playback mode, and a menu mode.

The display unit 203 is a liquid crystal display, an organic EL (Electro Luminescence) display, or the like to provide the display of a still image, video, a live view, or a menu screen depending on a display signal from a display control circuit 1008. The recording medium 204 is, for example, a nonvolatile memory card, a small hard disk, or the like, which is removable from a card slot, not illustrated.

Functional blocks of the LSI chip 100 will be described in detail below. The LSI chip 100 includes a memory control circuit 1101, a memory interface circuit (IF circuit) 1102, a memory bus 1103, a memory control circuit 1201, a memory interface circuit 1202, and a memory bus 1203. The LSI chip 100 also includes a CPU (Central Processing Unit) 1001, a CPU bus 1002, an imaging processing circuit 1003, a developing circuit 1004, an evaluation circuit 1005, a recognition circuit 1006, and a lens control circuit 1007. The LSI chip 100 further includes a display control circuit 1008, a still image encoding circuit 1009, a video encoding circuit 1010, a recording control circuit 1011, and a clock generation circuit 1012. In the following description, the imaging processing circuit 1003, the developing circuit 1004, the evaluation circuit 1005, the recognition circuit 1006, the lens control circuit 1007, the display control circuit 1008, the still image encoding circuit 1009, the video encoding circuit 1010, and the recording control circuit 1011 are called a variety of processing circuits.

Based on memory access requests from the variety of processing circuits of the LSI chip 100, the memory control circuit 1101 performs access control to the first memory chip 101 through the memory IF circuit 1102. The memory IF circuit 1102 sends and receives data based on a communication protocol with the first memory chip 101. The memory IF circuit 1102 may be formed from physical-layer hard macros. The memory bus 1103 connects the variety of processing circuits of the LSI chip 100 to the memory control circuit 1101, functioning as a transmission line for data transfer. The memory bus 1103 includes an arbitration circuit, and the arbitration circuit has the function of arbitrating access from the variety of processing circuits to the first memory chip 101.

Based on memory access requests from the imaging processing circuit 1003, the developing circuit 1004, the still image encoding circuit 1009, and the video encoding circuit 1010, the memory control circuit 1201 performs access control to the second memory chip 102 through the memory IF circuit 1202. The memory IF circuit 1202 sends and receives data based on a communication protocol with the second memory chip 102. The memory IF circuit 1202 may be formed from physical-layer hard macros. The memory bus 1203 connects the imaging processing circuit 1003, the developing circuit 1004, the still image encoding circuit 1009, and the video encoding circuit 1010 to the memory control circuit 1201, functioning as a transmission line for data transfer. The memory bus 1203 includes an arbitration circuit, and the arbitration circuit has the function of arbitrating access from the imaging processing circuit 1003, the developing circuit 1004, the still image encoding circuit 1009, and the video encoding circuit 1010 to the second memory chip 102.

The variety of processing circuits of the LSI chip 100 can all access the first memory chip 101. On the other hand, some circuits in the variety of processing circuits, namely, the imaging processing circuit 1003, the developing circuit 1004, the still image encoding circuit 1009, and the video encoding circuit 1010 can access the second memory chip 102. The other circuits, namely, the evaluation circuit 1005, the recognition circuit 1006, the lens control circuit 1007, the display control circuit 1008, and the recording control circuit 1011 cannot access the second memory chip 102.

The CPU 1001 is a processor core that controls the entire LSI chip 100. The CPU 1001 operates each functional block of the LSI chip 100 based on a program stored in a ROM (Read only memory), not illustrated. The CPU bus 1002 connects the CPU 1001, the variety of processing circuits, and the clock generation circuit 1012 to one another, functioning as a transmission line for performing data communication.

The imaging processing circuit 1003 performs processing on RAW data from the imaging unit 201, such as lens aberration correction, interpolation of a defective pixel of the image sensor, and black level compensation. The developing circuit 1004 performs debayer processing (demosaic processing) on the RAN data to convert the RAW data to image data composed of a luminance component and a color-difference component. The developing circuit 1004 performs image processing on the image data, such as white balance adjustment, gamma correction, edge enhancement, gradation conversion, denoising, and optical distortion correction. Processing performed the imaging processing circuit 1003 and the developing circuit 1004 is called development processing.

Based on the RAW data, the evaluation circuit 1005 calculates evaluated values representing a focus state, an exposure state, and the like. The recognition circuit 1006 detects subject information in the image data to generate the subject information. For example, the recognition circuit 1006 uses a technique such as template matching to detect the face of a person from image data and output information on the position and size of the face, and the like. The recognition circuit 1006 also has the function of authenticating the person based on the facial features.

Based on the evaluated values and the subject information, the lens control circuit 1007 controls the lens action of the imaging unit 201. For example, the lens control circuit 1007 determines the positions of a focus lens and a zoom lens, the aperture value, and the like, and outputs a drive signal to an actuator of the imaging unit 201. The display control circuit 1008 performs predetermined display processing on the image data to generate a display signal and output the display signal to the display unit 203.

The still image encoding circuit 1009 performs compression coding on image data using a known still image coding system such as a JPEG system to generate still image data the information amount of which is compressed. The video encoding circuit 1010 performs compression coding on image data using a known video compression coding system such as H.264 or H.265 to generate video data the information amount of which compressed. Processing performed by the still image encoding circuit 1009 and the video encoding circuit 1010 is called encoding processing.

The recording control circuit 1011 records, on the recording medium 204, RAW data, image data, still image data, video data, and the like. The recording control circuit 1011 also read data from the recording medium 204. The recording control circuit 1011 manages respective data recorded on the recording medium 204 as files according to a predetermined file system such as FAT (File Allocation Table).

The clock generation circuit 1012 generates a clock necessary for the operation of the image processing device 10. The clock generation circuit 1012 generates a clock at a desired frequency by multiplying or dividing a reference clock, and supplies the clock to the first memory chip 101 and the second memory chip 102 as well as the variety of processing circuits of the LSI chip 100. The clock generation circuit 1012 includes a clock gate. The clock gate can shut off the supply of the clock to the second memory chip 102 based on a control signal from the CPU 1001.

The CPU 1001 sets the mode of the digital camera according to a user's instruction through the operating unit 202. The CPU 1001 sets any one of a plurality of operation modes including a first operation mode and a second operation mode depending on the content of mode processing of the digital camera. The first operation mode is set when the amount of data transfer to the memory chip per unit time is relatively small and a required data transfer rate can be secured by using the first memory chip 101 alone. The second operation mode is set when the amount of data transfer to the memory chip per unit time is relatively large and data transfer to the second memory chip 102 is also required because the required data transfer rate cannot be secured by using the first memory chip 101 alone.

In the first operation mode, the CPU 1001 supplies a clock to the first memory chip 101, and stops clock supply to the second memory chip 102. Thus, the CPU 1001 operates the first memory chip 101, and limits the operation of the second memory chip 102. In the second operation mode, the CPU 1001 supplies the clock to the first memory chip 101 and the second memory chip 102 to operate the first memory chip 101 and the second memory chip 102.

For example, when the mode of the digital camera is set by the user to the menu mode, the live view mode, the single still image shooting mode, or the playback mode, the LSI chip 100 sets the first operation mode. When the mode of the digital camera is set by the user to the continuous still image shooting mode or the video recording mode, the LSI chip 100 sets the second operation mode.

The menu mode is a mode to display a menu screen and the like on the display unit 203 to configure various settings of the digital camera. The live view mode is a mode to display video data, obtained by the imaging unit 201, on the display unit 203 substantially in real time. In the live view mode, the compression coding of video data and recording of the video data on the recording medium 204 are not performed. The single still image shooting mode is a mode to generate still image data on one shot, perform the compression coding of the still image data, and record the still image data on the recording medium 204. The playback mode is a mode to play back and display, on the display unit 203, image data recorded on the recording medium 204. The video recording mode is a mode to generate video data, perform the compression coding of the video data, and record the video data on the recording medium 204. The continuous still image shooting mode is a mode to repeat a series of processing in the single still image shooting mode in a short period of time and record a plurality of pieces of still image data continuously on the recording medium 204.

Figure 3:
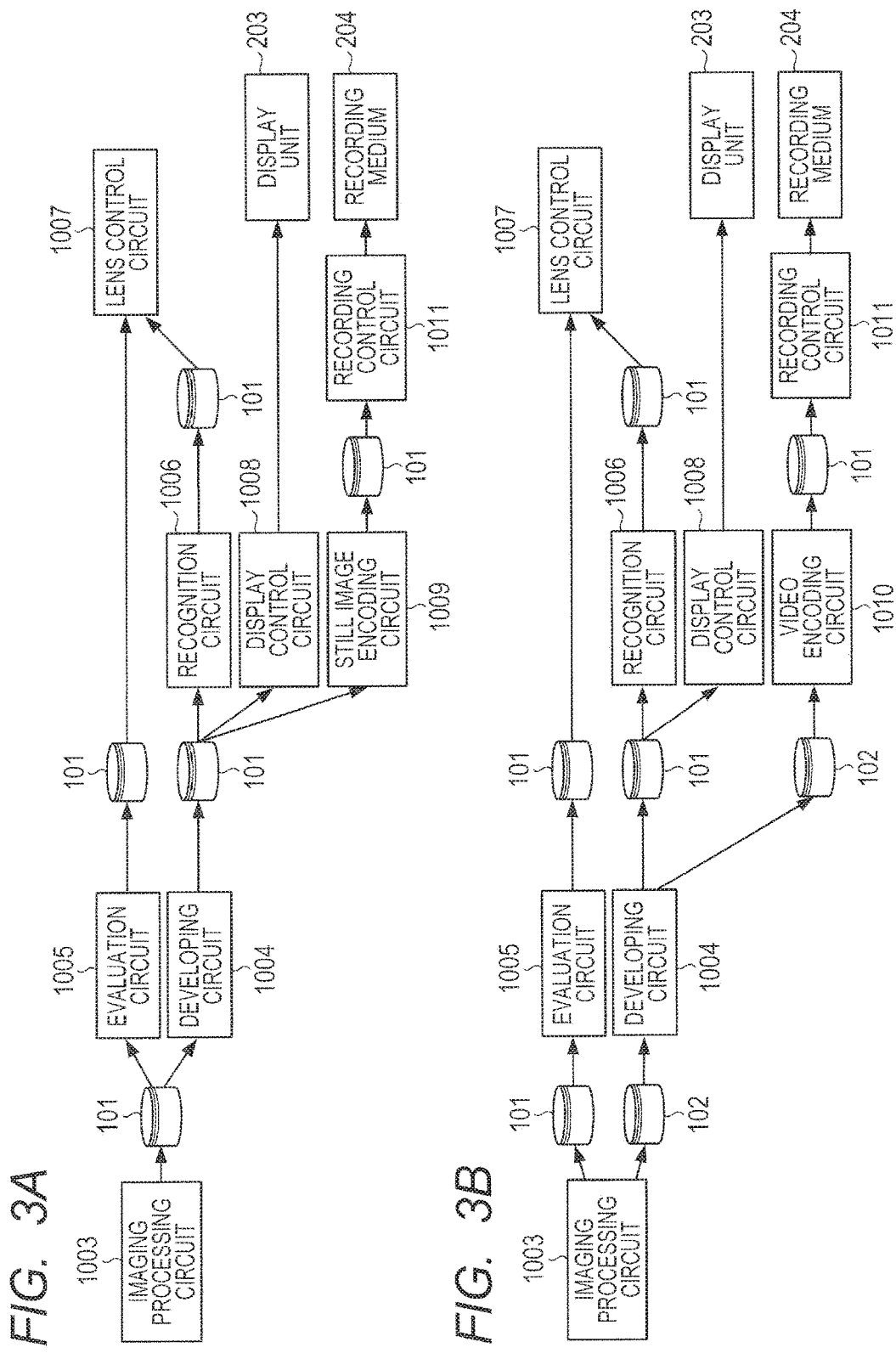
FIG. 3A is a diagram for describing a data path of the image processing device in the first embodiment.
FIG. 3B is a diagram for describing another data path of the image processing device in the first embodiment.

FIG. 3A and FIG. 3B are diagrams for describing data paths of the image processing device 10 in the embodiment. FIG. 3A illustrates a data path when the mode of the digital camera is set to the single still image shooting mode and the image processing device 10 operates in the first operation mode. In the single still image shooting mode, when the shutter button is held down, still image data on one shot are recorded. FIG. 3B illustrates another data path when the mode of the digital camera is set to the video recording mode and the image processing device 10 operates in the second operation mode. In the video recording mode, video data are recorded at a predetermined frame rate during a period after a video recording start button is held down until a video recording stop button is held down.

In FIG. 3A, the imaging processing circuit 1003 performs various correction and interpolation processing on RAW data captured from the imaging unit 201 and records the RAW data in the first memory chip 101. Note that storing and reading data from the variety of processing circuits to the first memory chip 101 are performed through the memory bus 1103, the memory control circuit 1101, and the memory IF circuit 1102.

The evaluation circuit 1005 reads RAW data from the first memory chip 101 and stores, in the first memory chip 101, evaluated values representing a focus state and an exposure state calculated based on the RAW data. The developing circuit 1004 reads the RAW data from the first memory chip 101 and converts the RAW data to still image data (image data). The developing circuit 1004 performs image processing on the still image data, and stores the still image data in the first memory chip 101.

The recognition circuit 1006 reads still image data from the first memory chip 101 and stores, in the first memory chip 101, subject information extracted from the still image data. The lens control circuit 1007 reads the evaluated values and subject information from the first memory chip 101, and controls the lens action of the imaging unit 201 based on these pieces of information. The display control circuit 1008 reads still image data from the first memory chip 101, generates a display signal, and outputs the display signal to the display unit 203. Thus, the still image data are displayed on the display unit 203.

The still image encoding circuit 1009 reads still image data from the first memory chip 101, performs still image coding processing, and stores, in the first memory chip 101, the still image data after being subjected to compression coding. The recording control circuit 1011 reads still image data from the first memory chip 101 and records the still image data on the recording medium 204.

In the single still image shooting mode, the second memory chip 102 is not used to read and store data. Therefore, in the single still image shooting mode, the CPU 1001 limits or prohibits the operation of the second memory chip 102. This can reduce the generation of heat by the second memory chip 102 and hence suppress a rise in the temperature of the LSI chip 100 on which the second memory chip 102 is stacked.

In FIG. 3B, the imaging processing circuit 1003 performs various correction and interpolation processing on RAW data from the imaging unit 201 and stores the RAW data in the first memory chip 101 and the second memory chip 102, respectively. Data from the imaging processing circuit 1003, the developing circuit 1004, the still image encoding circuit 1009, and the video encoding circuit are stored in and read from the second memory chip 102 through the memory bus 1203, the memory control circuit 1201, and the memory IF circuit 1202.

The evaluation circuit 1005 reads RAW data from the first memory chip 101. Since the subsequent operation in the data path to the lens control circuit 1007 is the same as that in FIG. 3A, the description thereof will be omitted.

The developing circuit 1004 reads RAW data from the second memory chip 102, and converts the RAW data to video data (image data). The developing circuit 1004 performs image processing on the video data, and stores the video data in the first memory chip 101 and the second memory chip 102, respectively.

The recognition circuit 1006 and the display control circuit 1008 read video data from the first memory chip 101, respectively. Since the subsequent operation in the data path to the lens control circuit 1007 is the same as that in FIG. 3A, the description thereof will be omitted.

The video encoding circuit 1010 reads video data from the second memory chip 102, performs video coding processing, and stores, in the first memory chip 101, the video data after being subjected to compression coding. The recording control circuit 1011 reads video data from the first memory chip 101 and records the video data on the recording medium 204.

In the video recording mode, after completion of the processing by the imaging processing circuit 1003 and the developing circuit 1004, the amount of data transfer to the memory chip per unit time becomes large, compared with that in the single still image shooting mode described with reference to FIG. 3A. Particularly, when video having a large number of pixels, such as 3840 pixels (horizontal)× 2160 pixels (vertical) or 7680 pixels (horizontal)×4320 pixels (vertical) per frame, and a high frame rate, such as 60 frames or 120 frames per second, is recorded, the amount of data to be transferred per unit time becomes very large. Therefore, in the video recording mode, the first memory chip 101 and the second memory chip 102 are used to store data after completion of the processing by the imaging processing circuit 1003. The evaluation circuit 1005 reads data from the first memory chip 101, and the developing circuit 1004 reads data from the second memory chip 102. Thus, the evaluation circuit 1005 and the developing circuit 1004 read data independently from the first memory chip 101 and the second memory chip 102, respectively, to secure the communication bandwidth (data transfer rate) with each memory chip to read data.

Even after completion of the processing by the developing circuit 1004, the first memory chip 101 and the second memory chip 102 are used to store data. The recognition circuit 1006 and the display control circuit 1008 read data from the first memory chip 101, and the video encoding circuit 1010 reads data from the second memory chip 102. The recognition circuit 1006, the display control circuit 1008, and the video encoding circuit 1010 read data independently from the first memory chip 101 and the second memory chip 102, respectively, to secure the communication bandwidth (data transfer rate) with each memory chip to read data.

Although the developing circuit 1004 reads RAW data from the second memory chip 102, the developing circuit 1004 may also read data from the first memory chip 101 and the second memory chip 102 in a distributed manner. For example, the developing circuit 1004 may read one half of data from the first memory chip 101 and the other half of data from the second memory chip 102 per unit time. In this case, it is only necessary for the imaging processing circuit 1003 to store half of RAW data in the second memory chip 102. Specifically, the imaging processing circuit 1003 stores RAW data in the first memory chip 101 and the second memory chip 102 alternately frame by frame. Alternatively, the imaging processing circuit 1003 stores the upper half of one frame in the first memory chip 101 and the lower half in the second memory chip 102.

Although the video encoding circuit 1010 reads video data from the second memory chip 102, the video encoding circuit 1010 may read data from the first memory chip 101 and the second memory chip 102 in a distributed manner like the developing circuit 1004. For example, the video encoding circuit 1010 may read one half of data from the first memory chip 101 and the other half of data from the second memory chip 102. In this case, it is only necessary for the developing circuit 1004 to store half of image data in the second memory chip 102. As the method of splitting data in half, for example, the developing circuit 1004 stores two halves of one frame in the first memory chip 101 and the second memory chip 102, respectively. In this case, data are split into odd lines and even lines. Alternatively, even frames or video data may be stored in the first memory chip 101, and odd frames may be stored in the second memory chip 102.

Figure 4:
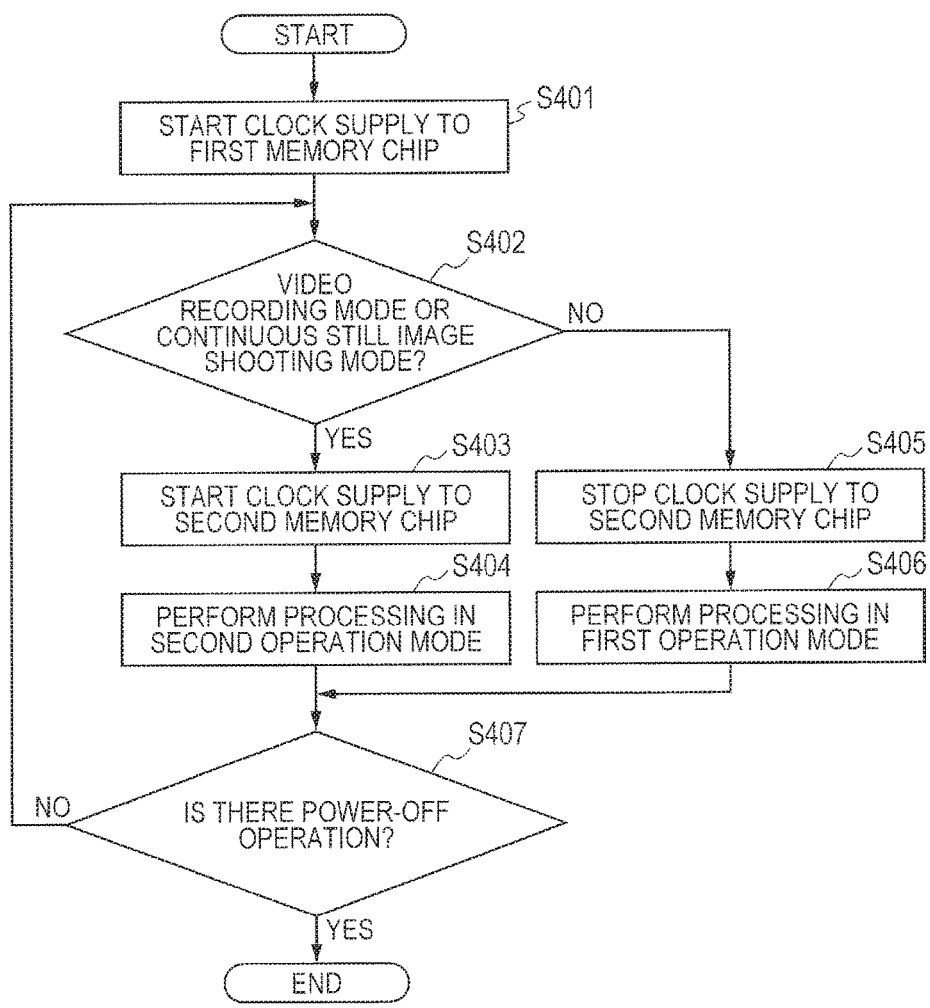
FIG. 4 is a flowchart illustrating mode switching processing of the image processing device in the first embodiment.

FIG. 4 is a flowchart illustrating mode switching processing of the image processing device 10 in the embodiment. When the user holds down the power switch of the operating unit 202 to power on the image processing device 10, the CPU 1001 starts clock supply to the first memory chip 101 in step S401. Specifically, the CPU 1001 outputs a control signal to the clock gate of the clock generation circuit 1012 to supply a clock from the clock generation circuit 1012 to the first memory chip 101.

In step S402, the CPU 1001 checks the mode of the digital camera. When the video recording mode or the continuous still image shooting mode is set (YES in step S402), the CPU 1001 starts clock supply to the second memory chip 102 in step S403, In step S404, the CPU 1001 performs processing in the second operation mode according to an instruction from the user through the operating unit 202.

When either one of the menu mode, the live view mode, the single still image the shooting mode, and the playback mode is set (NO in step S402), the CPU 1001 stops clock supply to the second memory chip 102 in step S405. Specifically, the CPU 1001 outputs a control signal to the clock gate of the clock generation circuit 1012 to shut off the supply of the clock from the clock generation circuit 1012 to the second memory chip 102. In step S406, the CPU 1001 performs processing in the first operation mode according to a user's instruction through the operating unit 202.

In step S407, the CPU 1001 determines whether the user performs an operation to power off the image processing device 10. For example, the CPU 1001 determines whether the power switch of the operating unit 202 is held down. When determining that there is the power-off operation (YES in step S407), the CPU 1001 shuts off the power of the image processing device 10 to end the mode switching processing. When determining that there is no power-off operation (NO in step S407), the CPU 1001 returns to processing step S402.

In the above description, the example in which the image processing device 10 operates in the second operation mode when the mode As the video recording mode or the continuous still image shooting mode is taken, but the present invention is not limited to this example. The image processing device 10 may be configured to operate in the second operation mode only when video data with a relatively high resolution and a high frame rate are recorded. In other words, when video data with a low resolution and a lows frame rate are recorded or a plurality of pieces of still image data are continuously recorded, the image processing device 10 may be configured to perform processing in the first operation mode without using the second memory chip 102.

For example, the user uses the operating unit 202 to set shooting conditions on video data, such as resolution (the number of pixels), frame rate, and compression rate. The CPU 1001 estimates, from the shooting conditions, a data transfer rate required for the memory chip, and compares the estimated data transfer rate with the data transfer rate of the first memory chip 101. This enables the CPU 1001 to determine which of the first operation mode and the second operation mode is set. When the estimated data transfer rate is higher than the data transfer rate of the first memory chip 101, the CPU 1001 can set the second operation mode.

The CPU 1001 may also compare any of the set shooting conditions with a predetermined threshold value to determine the operation mode to be set. For example, in the video recording mode or the continuous still image shooting mode, when the resolution is set to a value larger than a predetermined threshold value, the CPU 1001 may set the second operation mode, while when the resolution is set to a value equal to or smaller than the predetermined threshold value, the CPU 1001 may set the first operation mode. Similarly, when the frame rate is set to a value larger than a predetermined threshold value, the CPU 1001 may set the second operation mode, while when the frame rate is set to value equal to or smaller than the predetermined threshold value, the CPU 1001 may set the first operation mode. Further, the CPU 1001 may set an operation mode based on a table indicating the correspondence between each of the set shooting conditions and an operation mode.

According to the embodiment, the first memory chip 101 is arranged (laid) adjacent to the LSI chip 100, and the second memory chip 102 is stacked on the LSI chip 100. When video data having a small number of pixels and a low frame rate are recorded, or when one piece of still image data is recorded in the single still image shooting mode, the first memory chip 101 is operated and the operation of the second memory chip 102 is limited or prohibited. Since the second memory chip 102 is stacked on the LSI chip 100, the heat dissipation of the second memory chip 102 is low compared with the laid first memory chip 101. The heat generation by the second memory chip 102 with lower heat dissipation between the two memory chips is reduced, and this can suppress a temperature rise effectively to suppress a rise in the temperature of the image processing device 10. When video data having a large number of pixels, and high frame rate and bit rate after being subjected to compression are recorded, the second memory chip 102 can be operated in addition to the first memory chip 101 to secure a required processing capacity.

Further, in the embodiment, clock supply to the second memory chip 102 is stopped in the first operation mode, but the frequency of the clock to be supplied may be reduced instead. In this case, the configuration is such that the frequency of the clock generated by the clock generation circuit 1012 can be changed. Then, the CPU 1001 controls the clock generation circuit 1012 to supply, in the first operation mode, a clock with a frequency lower than the frequency of the clock supplied to the second memory chip 102 in the second operation mode.

In an imaging apparatus such as the digital camera, the shooting time in the video recording mode or the continuous still image shooting mode is often a relatively short, and the use rate of the image processing device 10 in each operation mode is such that the first operation mode is dominant and the second operation mode is limited. Since the image processing device 10 takes a long time to limit the operation of the second memory chip 102, a high suppressive effect on heat generation can be obtained.

Second Embodiment

In the first embodiment, such a configuration of the image processing device 10 as to stop clock supply to the second memory chip 102 in the first operation mode in order to reduce heat generation from the second memory chip 102 is described. In this embodiment, a configuration to stop power supply to the second memory chip 102 in the first operation mode in order to further reduce heat generation from the second memory chip 102 will be described.

Figure 5:
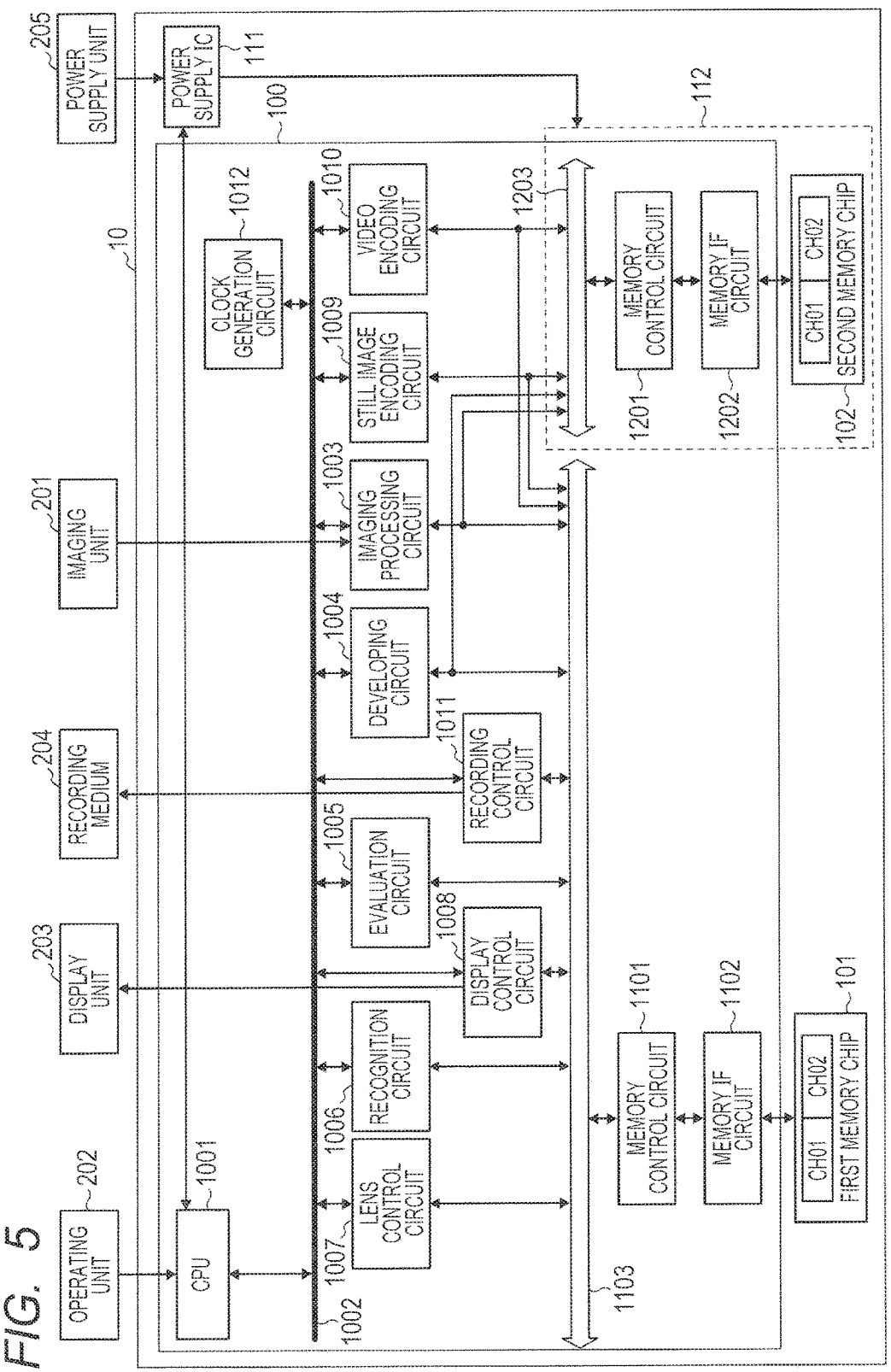
FIG. 5 is a block diagram of an image processing device in a second embodiment.

FIG. 5 is a block diagram of an image processing device 10 in the embodiment. Note that the same reference numerals are given to the same components in FIG. 2 described in the first embodiment to omit redundant description. A configuration different from that of the first embodiment will be mainly described below. A digital camera includes the imaging unit 201, the operating unit 202, the display unit 203, the recording medium 204, a power supply unit 205, and the image processing device 10. The image processing device 10 includes the LSI chip 100, the first, memory chip 101, the second memory chip 102, and a power supply IC (Integrated Circuit) 111.

The power supply unit 205 includes a primary battery such as an alkaline battery, and a secondary battery such as a lithium-ion rechargeable battery or a nickel-metal-hydride battery to supply predetermined DC power to the power supply IC 111. The power supply unit 205 may an AC (Alternating Current) adapter to commercial AC power supply to DC power supply.

The power supply IC 111 is composed of a DC (Direct Current)-DC converter, a regulator, a switch circuit, and the like to control power supply from the power supply unit 205. The DC-DC converter is, for example, a switching type constant-voltage output circuit to convert the voltage of the power supply unit 205 to predetermined voltage according to each circuit block of the image processing device 10. The regulator suppresses fluctuations in the output voltage of the DC-DC converter to supply fixed voltage to each circuit block. The switch circuit switches among power supply destinations based on instructions from the CPU 1001.

In the first operation mode, the CPU 1001 controls the power supply IC 111 to power off a power shut-off region 112. The power shut-off region 112 is one of circuit blocks supplied with power from the power supply IC 111, and the second memory chip 102, the memory control circuit 1201, and the memory IF circuit 1202 are included in the power shut-off region 112.

Figure 6:
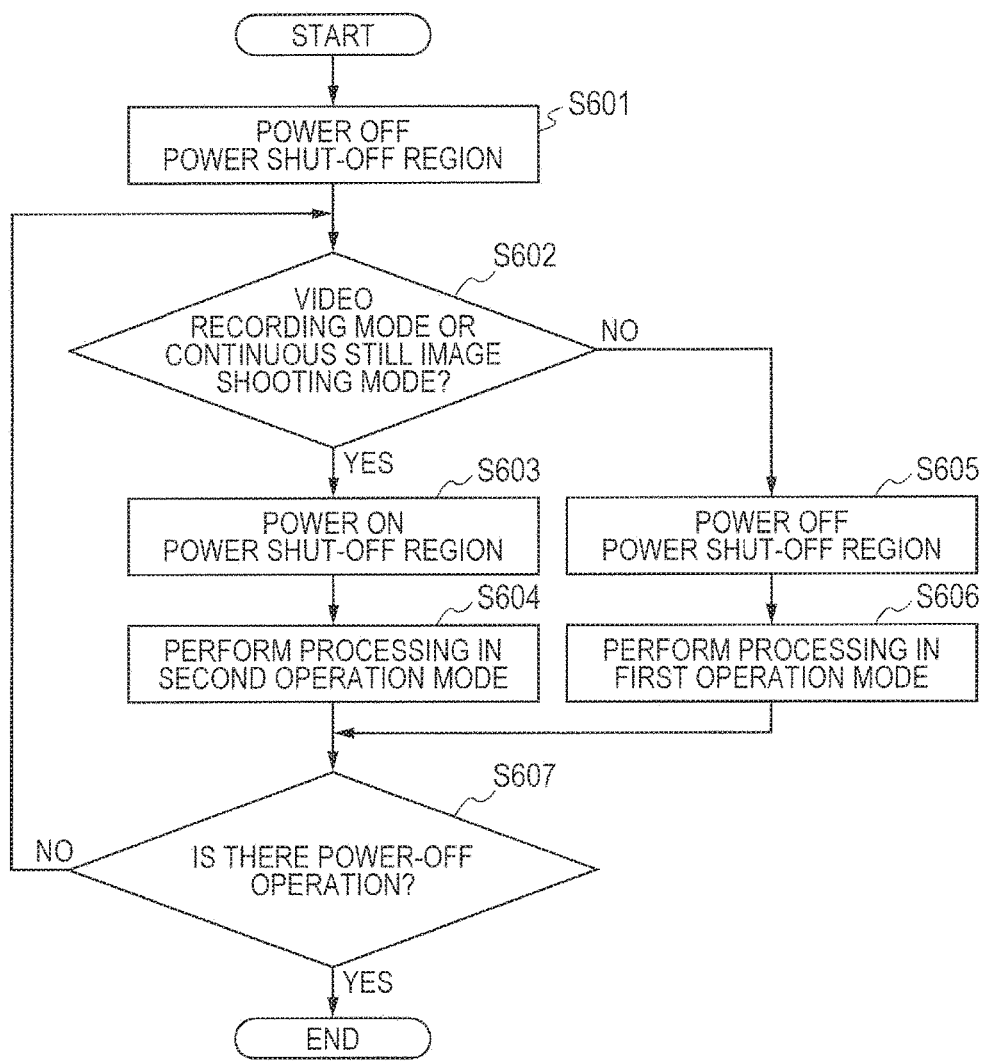
FIG. 6 is a flowchart illustrating power shut-off processing of the image processing device in the second embodiment.

FIG. 6 is a flowchart illustrating power shut-off processing of the image processing device 10 in the embodiment. When the user holds down the power switch of the operating unit 202 to power on the image processing device 10, the CPU 1001 starts power supply to each circuit block of the image processing device 10 in step S601. Specifically, the CPU 1001 outputs a control signal to the power supply IC 111 to energize each circuit block. However, the CPU 1001 powers off the power shut-off region 112 in step S601 without energizing the power shut-off region 112.

In step S602, the CPU 1001 checks the mode of the digital camera. When the video recording mode or the continuous still image shooting mode is set (YES in step S602), the CPU 1001 supplies power to the power shut-off region 112 in step S603. In other words, the CPU 1001 outputs a control signal to the power supply IC 111 to energize the power shut-off region 112. In step S604, the CPU 1001 performs processing in the second operation mode according to an instruction from the user through the operating unit 202.

When either one of the menu mode, the live view mode, the single still image the shooting mode, and the playback mode is set (NO in step S602), the CPU 1001 powers off the power shut-off region 112 in step S605. In other words, the CPU 1001 outputs a control signal to the power supply IC 111 to stop power supply to the power shut-off region 112. In step S606, the CPU 1001 performs processing in the first operation mode according to an instruction from the user through the operating unit 202.

In step S607, the CPU 1001 determines whether the user performs an operation to power off the image processing device 10. When determining that there is the power-off operation (YES in step S607), the CPU 1001 powers off the entire image processing device 10 to end the power shut-off processing. When determining that there is no power-off operation (NO in step S607), the CPU 1001 returns to processing step S602.

According to the embodiment, power supply to the second memory chip 102, which is not used in the first operation mode, can be stopped in the image processing device 10. This can reduce leakage power of the second memory chip 102 to further reduce a rise in the temperature of the image processing device 10.

Other Embodiments

While the preferred embodiments of the present invention have been described, the present invention is not limited to these embodiments, and various modifications and changes are possible within the gist of the present invention. For example, limiting the operation of the memory chip can include a state of reducing part of consumption current in the memory chip, in addition to stopping the operation of the memory chip. In the first embodiment, the LSI chip 100 may also reduce the frequency of the clock to be supplied to the second memory chip 102 to limit the operation of the second memory chip 102 in order to suppress heat generated in the second memory chip 102.

Further, in the second embodiment, power supply to the second memory chip 102 is shut off (stopped) in the first operation mode. Otherwise, for example, voltage lower than the voltage at which the second memory chip 102 is normally operable may be supplied in the first operation mode.

The configurations of the first embodiment and the second embodiment described above can be combined. For example, in the second operation mode, the second memory chip 102 may be powered off while stopping clock supply to the second memory chip 102. Further, voltage to be supplied to the second memory chip 102 may be reduced while supplying the clock to the second memory chip 102. Further, the determinations on clock supply and power off may be made based on different conditions, respectively.

The LSI chip 100 can include any functional blocks that implement the functions of the image processing device 10. The LSI chip 100 may be formed of a combination of a plurality of functional blocks, and one functional block may be formed of a plurality of functional blocks. The LSI chip 100 can determine access to each memory chip according to the processing content of each functional block to perform processing in each operation mode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-223292, filed Nov. 16, 2016, which is hereby incorporated by reference herein in its entirety.

What is claimed is:

1. An image processing device comprising:
an integrated circuit chip arranged on a substrate to perform processing on image data;
a first memory chip arranged adjacent to the integrated circuit chip on the substrate and connected to the integrated circuit chip; and
a second memory chip stacked on the integrated circuit chip and connected to the integrated circuit chip,
wherein the integrated circuit chip switches, according to the processing on the image data, between operation modes including a first operation mode to operate the first memory chip and limit operation of the second memory chip, and a second operation mode to operate the first memory chip and the second memory chip.

2. The image processing device according to claim 1, wherein an amount of data transfer to the first memory chip and the second memory chip per unit time in the second operation mode is larger than an amount of data transfer to the first memory chip per unit time in the first operation mode.

3. The image processing device according to claim 1, wherein the integrated circuit chip has a plurality of circuits to perform the processing, the first memory chip is accessible from the plurality of circuits, and the second memory chip is accessible from some of the plurality of circuits.

4. The image processing device according to claim 3, wherein some of the plurality of circuits include at least either one of a circuit that performs development processing to generate image data from RAW data and a circuit that performs encoding processing to compress image data.

5. The image processing device according to claim 1, wherein the integrated circuit chip stops clock supply to the second memory chip in the first operation mode.

6. The image processing device according to claim 1, wherein the integrated circuit chip stops power supply to the second memory chip in the first operation mode.

7. The image processing device according to claim 1, wherein the integrated circuit chip has an interface circuit that performs data transfer to the second memory chip and a memory control circuit that controls the data transfer, and stops power supply to the interface circuit and the memory control circuit in the first operation mode.

8. The image processing device according to claim 1, wherein the image processing device has a plurality of modes including a menu mode to configure settings of the image processing device, a live view mode to display video data processed by the image processing device without recording the video data, a single still image shooting mode to record one piece of still image data, and a playback mode to play back and display recorded image data, axed, when any one of the menu mode, the live view mode, the single still image shooting mode, and the playback mode is et as the mode of the image processing device the integrated circuit chip sets the first operation mode.

9. The image processing device according to claim 1, wherein the image processing device has a video recording mode to record video data and a continuous still image shooting mode to record a plurality of pieces of still image data continuously, and when either one of the video recording mode and the continuous still image shooting mode is set as the mode of the mage processing device, the integrated circuit chip sets second operation mode.

10. The image processing device according to claim 9, wherein when are solution of video data or still image data to be recorded is larger than a predetermined threshold value, the integrated circuit chip sets the second operation mode, while where the resolution equal to or smaller than the predetermined threshold value, the integrated circuit chip sets the first operation mode.

11. The image processing device according to claim 9, wherein when a frame rate of video data or still image data to be recorded is larger than a predetermined threshold value, the integrated circuit chip sets the second operation mode, while when the frame rate is equal to or smaller than the predetermined threshold value, the integrated circuit chip sets the first operation anode.

12. The image processing device according to claim 1, wherein the second chip is stacked on the integrated circuit chip through a relay substrate.

13. A control method for an image processing device including:
    an integrated circuit chip arranged on a substrate to perform processing on image data;
    a first memory chip arranged adjacent to the integrated circuit chip on the substrate and connected to the integrated circuit chip; and
    a second memory chip stacked on the integrated circuit chip and connected to the integrated circuit chip, the control method comprising:
    determining the processing on the image data; and
    switching according to the processing on the image data, between operation modes including a first operatic mode to operate the first memory chip and limit operation of the second memory chip, and a second operation mode to operate the first memory chip and the second memory chip.

14. An image processing device connected to an imaging unit and a display, the image processing device comprising:
    an integrated circuit chip arranged on a substrate to perform processing on image data;
    a first memory chip arranged adjacent to the integrated circuit chip on the substrate and connected to the integrated circuit chip; and
    a second memory chip stacked on the integrated circuit chip and connected to the integrated circuit chip, wherein
    the integrated circuit chip controls the first memory chip and the second memory chip such that heat dissipation of the second memory chip in a first mode of displaying video data processed by the image processing device the display, becomes lower than that in a second mode.

15. The image processing device according to claim 14, wherein
    the second mode is a mode in which video the data processed by the image processing device is recorded on a recording medium.

16. The image processing device according to claim 14, wherein
    the integrated circuit chip controls a frequency of clocks supplied to the second memory chip in the first mode is lower than that in the second mode.

* * * * *